United States Patent

Gardner et al.

[11] Patent Number: 5,904,529
[45] Date of Patent: May 18, 1999

[54] METHOD OF MAKING AN ASYMMETRICAL IGFET AND PROVIDING A FIELD DIELECTRIC BETWEEN ACTIVE REGIONS OF A SEMICONDUCTOR SUBSTRATE

[75] Inventors: Mark I. Gardner, Cedar Creek; Daniel Kadosh, Austin, both of Tex.

[73] Assignee: Advanced Micro Devices, Inc., Sunnyvale, Calif.

[21] Appl. No.: 08/918,202

[22] Filed: Aug. 25, 1997

[51] Int. Cl.$^6$ .................................................. H01L 21/336
[52] U.S. Cl. ......................... 438/286; 438/307; 438/595
[58] Field of Search .................................. 438/197, 286, 438/301, 303, 305, 306, 307, 585, 947, 595, 299, FOR 175, FOR 190

[56] References Cited

U.S. PATENT DOCUMENTS

| | | | |
|---|---|---|---|
| 4,225,875 | 9/1980 | Ipri | 257/353 |
| 4,258,465 | 3/1981 | Yasui et al. | 438/286 |
| 4,272,881 | 6/1981 | Angle | 438/284 |
| 4,597,827 | 7/1986 | Nishitani et al. | 438/286 |
| 4,737,828 | 4/1988 | Brown | 438/286 |
| 4,927,777 | 5/1990 | Hsu et al. | 438/305 |
| 5,073,514 | 12/1991 | Ito et al. | 438/305 |
| 5,132,753 | 7/1992 | Chang et al. | 257/655 |

(List continued on next page.)

FOREIGN PATENT DOCUMENTS

| | | |
|---|---|---|
| 0 160 255 | 11/1985 | European Pat. Off. . |
| 0 186 058 | 7/1986 | European Pat. Off. . |
| 0 187 016 A2 | 7/1986 | European Pat. Off. . |
| 0 575 099 A1 | 12/1993 | European Pat. Off. . |
| 56-104470 | 8/1981 | Japan ............................ 438/FOR 190 |
| 61-194777 | 8/1986 | Japan . |
| 61-194777 | 1/1987 | Japan . |
| 4-18762 | 1/1992 | Japan ................................... 257/408 |
| 08078672 | 3/1996 | Japan . |

OTHER PUBLICATIONS

Codella et al; U.S. Statutory Invention Registration H986; Nov. 05, 1991.

(List continued on next page.)

*Primary Examiner*—Michael Trinh
*Attorney, Agent, or Firm*—Skjerven, Morrill, MacPherson, Franklin & Friel LLP

[57] ABSTRACT

A method of making an asymmetrical IGFET and isolating active regions is disclosed. The method includes providing a semiconductor substrate with an active region and a field region, wherein the active region includes a source region and a drain region, and the active region is adjacent to the field region, forming a dielectric layer over the substrate, forming a first etch mask over the dielectric layer, etching a selected portion of the dielectric layer beneath an opening in the first etch mask, wherein a first unetched portion of the dielectric layer provides a field dielectric over the field region, a second unetched portion of the dielectric layer provides a drain-protect dielectric over the drain region, and the dielectric layer is removed above the source region, forming a gate insulator on a portion of the active region outside the drain-protect dielectric, depositing a gate material over the drain-protect dielectric and the gate insulator, polishing the gate material so that a portion of the gate material over the drain-protect dielectric is removed, forming a second etch mask over the gate material, etching the gate material beneath an opening in the second etch mask to remove a portion of the gate material over the source region, wherein an unetched portion of the gate material forms a gate, and a sidewall of the gate is adjacent to a sidewall of the drain-protect dielectric, implanting a dopant into the active region during a first implant step, wherein a greater concentration of the dopant is implanted in the source region than in the drain region due to the drain-protect dielectric, and forming a source in the source region and a drain in the drain region. Advantageously, the dielectric layer provides both the field dielectric and the drain-protect dielectric to reduce process steps, and the IGFET has low source-drain resistance and reduces hot carrier effects.

40 Claims, 10 Drawing Sheets

U.S. PATENT DOCUMENTS

| | | | |
|---|---|---|---|
| 5,171,700 | 12/1992 | Zamanian | 438/44 |
| 5,200,358 | 4/1993 | Bollinger et al. | 437/180 |
| 5,286,664 | 2/1994 | Horiuchi | 438/286 |
| 5,296,398 | 3/1994 | Noda | 437/44 |
| 5,349,225 | 9/1994 | Redwine et al. | 257/336 |
| 5,364,807 | 11/1994 | Hwang | 438/286 |
| 5,366,915 | 11/1994 | Kadama | 438/286 |
| 5,397,715 | 3/1995 | Miller | 438/268 |
| 5,424,229 | 6/1995 | Oyamatsu | 437/35 |
| 5,424,234 | 6/1995 | Kwon | 438/305 |
| 5,436,482 | 7/1995 | Ogoh | 257/344 |
| 5,444,024 | 8/1995 | Anjum et al. | 438/200 |
| 5,451,807 | 9/1995 | Fujita | 257/404 |
| 5,510,279 | 4/1996 | Chien et al. | 438/302 |
| 5,512,503 | 4/1996 | Hong | 438/306 |
| 5,512,506 | 4/1996 | Chang et al. | 438/44 |
| 5,518,940 | 5/1996 | Hodate et al. | 438/151 |
| 5,521,417 | 5/1996 | Wada | 257/390 |
| 5,525,552 | 6/1996 | Huang | 438/297 |
| 5,547,885 | 8/1996 | Ogoh | 438/286 |
| 5,547,888 | 8/1996 | Yamazaki | 438/279 |
| 5,550,084 | 8/1996 | Anjum et al. | 438/200 |
| 5,578,509 | 11/1996 | Fujita | 438/286 |
| 5,580,815 | 12/1996 | Hsu et al. | 438/69 |
| 5,585,293 | 12/1996 | Sharman et al. | 438/261 |
| 5,585,658 | 12/1996 | Mukai et al. | 257/344 |
| 5,607,869 | 3/1997 | Yamazaki | 438/286 |
| 5,643,825 | 7/1997 | Gardner et al. | 437/70 |
| 5,648,286 | 7/1997 | Gardner et al. | 437/44 |
| 5,654,215 | 8/1997 | Gardner et al. | 438/286 |
| 5,656,518 | 8/1997 | Gardner et al. | 438/286 |
| 5,672,531 | 9/1997 | Gardner et al. | 438/286 |
| 5,677,224 | 10/1997 | Kadosh et al. | 257/274 |
| 5,801,088 | 9/1998 | Gardner et al. | 438/947 |

OTHER PUBLICATIONS

U.S. Patent Application Serial No. 08/884,802, filed Jun. 30, 1997, entitled "Method Of Making An IGFET And A Protected Resistor With Reduced Processing Steps," by Gardner et al. (copy encloded), pending.

U.S. Patent Application Serial No. 08/781,092, filed Jan. 8,1997, entitled "Method Of Forming Lightly Doped Drain Region And Heavily Doping A Gate Using A Single Implant Step", by Gardner et al. (copy enclosed), pending.

U.S. Patent Application Serial No. 08/682,238 filed Jul. 17, 1996 entitled "Method For Fabricating of a Non–Symmetrical Transistor" by Gardner et al. (copy not enclosed), pending.

IBM Technical Disclosure Bulletin, "Process for Making Very Small, Asymmetric, Field–Effect Transistors", vol. 30, No. 3, Aug. 1987, pp. 1136–1137 (XP 000671026).

IBM Technical Disclosure Bulletin, "Low Series Resistance Source by Spacer Methods", vol. 33, No. 1A, Jun. 1, 1990, pp. 75–77 (XP 000120044).

METHOD OF MAKING AN ASYMMETRICAL IGFET AND PROVIDING A FIELD DIELECTRIC BETWEEN ACTIVE REGIONS OF A SEMICONDUCTOR SUBSTRATE

BACKGROUND OF THE INVENTION

1. Filed of the Invention

The present invention relates to integrated circuit manufacturing, and more particularly to a method of making insulated-gate field-effect transistors.

2. Description of Related Art

An insulated-gate field-effect transistor (IGFET), such as a metal-oxide semiconductor field-effect transistor (MOSFET), uses a gate to control an underlying surface channel joining a source and a drain. The channel, source and drain are located in a semiconductor substrate, with the source and drain being doped oppositely to the substrate. The gate is separated from the semiconductor substrate by a thin insulating layer such as a gate oxide. The operation of the IGFET involves application of an input voltage to the gate, which sets up a transverse electric field in the channel in order to modulate the longitudinal conductance of the channel.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anisotropically etched to provide the gate. Thereafter, the gate provides an implant mask during the implantation of source and drain regions, and the implanted dopants are driven-in and activated using a high-temperature anneal that would otherwise melt the aluminum.

Photolithography is frequently used to create patterns that define where the polysilicon layer is etched. Typically, the wafer is cleaned and prebaked to drive off moisture and promote adhesion, an adhesion promoter is deposited on the wafer, a few milliliters of positive photoresist are deposited onto the spinning wafer to provide a uniform layer, the photoresist is soft baked to drive off excess solvents, the photoresist is irradiated with an image pattern that renders selected portions of the photoresist soluble, a developer removes the irradiated portions of the photoresist, an optional de-scum removes very small quantities of photoresist in unwanted areas, the photoresist is hard baked to remove residual solvents and improve adhesion and etch resistance, the etch is applied using the photoresist as an etch mask, and the photoresist is stripped. Therefore, the photoresist has the primary functions of replicating the image pattern and protecting the underlying polysilicon when etching occurs.

In general, the term "resolution" describes the ability of an optical system to distinguish closely spaced objects. The minimum resolution of a photolithographic system is the dimension of minimum linewidth or space that the machine can adequately print or resolve. While optical photolithography continues to be the dominant technology in semiconductor manufacturing because it is well established and is capable of implementing sub-micron resolution at least as low as 0.35 microns using current equipment, as feature sizes approach 0.5 microns and below, and these features extend across wafer areas of a square inch and more, extensive efforts are being directed at developing alternative technologies. Electron-beam and X-ray technologies have demonstrated patterning capabilities that extend beyond the limits of optical systems. However, these alternative approaches have certain drawbacks. For instance, electron-beam lithography has low throughput that lags far behind the requirements of industrial applications, and X-ray lithography has very high investment costs associated with synchrotron radiation sources as well as problems with mask accuracy, alignment, and wafer distortion.

Thus, workers in the art recognize that there are obvious incentives for trying to push the currently dominant technology (optical photolithography) into the fine-line region. Such an effort, if successful, has the potential for significantly better patterning capabilities, which in turn reduces the dimensions of the devices.

As IGFET dimensions are reduced and the supply voltage remains constant (e.g., 3V), the electric field in the channel near the drain tends to increase. If the electric field becomes strong enough, it can give rise to so-called hot-carrier effects. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage of the device.

A number of techniques have been utilized to reduce hot carrier effects. One such technique is a lightly doped drain (LDD). The LDD reduces hot carrier effects by reducing the maximum lateral electric field. The drain is typically formed by two ion implants. A light implant is self-aligned to the gate, and a heavy implant is self-aligned to spacers adjacent to the gate. The spacers are typically oxides or nitrides. The purpose of the lighter dose is to form a lightly doped region of the drain (or LDD) at the edge near the channel. The heavier dose forms a low resistivity heavily doped region of the drain. Since the heavily doped region is farther away from the channel than a conventional drain structure, the depth of the heavily doped region can be made somewhat greater without adversely affecting the device characteristics. A known fabrication sequence includes forming lightly doped source/drain regions, forming the spacers, and then forming heavily doped source/drain regions. Another known fabrication sequence includes forming disposable spacers, forming heavily doped source/drain regions, removing the disposable spacers, and then forming lightly doped source/drain regions (between the heavily doped source/drain regions and the gate).

Disadvantages of LDDs include increased fabrication complexity and increased parasitic resistance due to their light doping levels. During operation, LDD parasitic resistance decreases drain current. Linear drain current (in the linear or triode region) is reduced by the parasitic resistance in both the source and drain. Saturation drain current (in the saturation region) is largely unaffected by the parasitic resistance of the drain but greatly reduced by the parasitic resistance of the source. Therefore, saturation drain current can be improved while reducing hot carrier effects by providing a lightly doped region only on the drain side. That is, the drain includes lightly and heavily doped regions, and the entire source is heavily doped.

Asymmetrical IGFETs (with asymmetrically doped sources and drains) are known in the art. For instance, U.S. Pat. No. 5,424,229 entitled "Method For Manufacturing MOSFET Having An LDD Structure" by Oyamatsu discloses providing a mask with an opening over a substrate, implanting a dopant through the opening at an angle to the substrate to form a lightly doped drain region on one side without a corresponding source region on the other side, forming a gate in the opening which overlaps the lightly doped drain region, removing the mask, and implanting heavily doped source and drain regions using the gate as an implant mask. As another example, U.S. Pat. No. 5,286,664 entitled "Method For Fabricating The LDD-MOSFET" by Horiuchi discloses forming a gate, implanting lightly doped source and drain regions using the gate as an implant mask, forming a photoresist layer that covers the source side and exposes the drain side, forming a single spacer on the drain side using liquid phase deposition (LPD) of silicon dioxide, stripping the photoresist, and implanting heavily doped source and drain regions using the gate and single spacer as an implant mask.

A drawback to conventional asymmetrical IGFETs is that typically the heavily doped source and drain regions are the most heavily doped regions of the source and drain and have identical dopant concentrations. Although the doping concentration of the heavily doped drain region may be constrained in order to reduce hot carrier effects, the doping concentration of the heavily doped source region need not be constrained in this manner. Furthermore, increasing the doping concentration of the heavily doped source region reduces source-drain series resistance, thereby improving drive current.

Providing low resistance contacts for the gate, source and drain can be accomplished using refractory metal silicide. In one approach, a thin layer of refractory metal is deposited over the structure after forming the lightly and heavily doped source/drain regions and the spacers, and heat is applied to form silicide contacts wherever the refractory metal is adjacent to silicon (including single crystal silicon and polysilicon). Thereafter, an etch is applied that removes unreacted refractory metal over the spacers to prevent bridging silicide contacts for the gate, source and drain. Various silicides such as titanium silicide ($TiSi_2$), tungsten silicide ($WSi_2$), molybdenum silicide ($MoSi_2$), cobalt silicide ($CoSi_2$) and tantalum silicide ($TaSi_2$) have been used for this purpose. For instance, the sheet resistance of titanium silicide is as low as 3 to 6 $\Omega$/sq, whereas heavily doped polysilicon exhibits a sheet resistance on the order of 15 to 30 $\Omega$/sq. Another advantage to this approach is that the silicide contacts for the gate, source and drain are formed simultaneously and are self-aligned by the spacers. This self-aligned silicide is sometimes referred to as "salicide."

In complex integrated circuits, several hundred thousand or millions of active devices (transistors, capacitors, diodes, resistors, etc.) are fabricated on a single monolithic substrate, and an interconnect structure includes patterned conductive lines for interconnecting the active devices according to a specific circuit function. Typically, the active devices are formed in active regions of the substrate, and the active regions are separated by field regions of the substrate. IGFETs are generally self-isolated provided the source and drain are reverse-biased with respect to the substrate. However, field dielectrics are usually formed on the field regions to prevent the refractory metal from reacting with the field region, thereby avoiding silicide bridges between active regions. Furthermore, field dielectrics are usually thick enough to prevent overlying conductive lines from forming channels in the field regions, thereby avoiding parasitic devices in the field regions. Field dielectrics are often on the order of 2000 to 5000 angstroms thick.

LOCOS is a well-known technique for providing field dielectrics. LOCOS includes forming a pad oxide over the substrate, forming a nitride layer over the pad oxide, etching the nitride layer over the field regions, and thermally growing the pad oxide over the field regions. LOCOS can be carried out using many different process flows, including semi-recessed or fully-recessed techniques. However, LOCOS can cause problems. For instance, bird's beak encroachment can cause submicron active regions to virtually disappear unless rework is done. Oxidation-enhanced diffusion can cause perpendicular segregation of shallow channel-stop implants such as boron. In addition, Kooi ribbons of silicon nitride can form on the active region due to the reaction of $NH_3$ (which diffuses through the pad oxide) and the silicon surface. Since Kooi ribbons degrade gate oxide quality, often a sacrificial oxide must be formed and stripped to remove the ribbons before growing the gate oxide.

U.S. Pat. No. 5,643,825 entitled "Integrated Circuit Isolation Process" by Gardner et al. discloses a promising alternative to LOCOS. The improved process utilizes a blanket formation of first and second dielectrics across an entire semiconductor substrate. In a subsequent step, the first and second dielectrics are removed in areas overlying the active regions. The resulting field dielectric structure is relatively thin, yet demonstrates superior dielectric properties.

Based on the foregoing, a need exists for an improved method of making an IGFET and a field dielectric between active regions, particularly where the IGFET is an asymmetrical device with low source-drain resistance, an LDD and an extremely narrow gate, silicide contacts are formed on the gate, source and drain, the field dielectric substantially eliminates encroachment and other problems associated with LOCOS, and relatively few processing steps are required.

SUMMARY OF THE INVENTION

An object of the invention is to provide a high-performance, asymmetrical IGFET and a field dielectric that fulfills the need in the art described above. Generally speaking, this is accomplished by forming a field dielectric and a drain-protect dielectric from portions of a blanket dielectric layer over the substrate. The field dielectric is formed over a field region, without the use of LOCOS, to provide isolation between active regions. The drain-protect dielectric is formed over a drain region, but not a source region, so that during a subsequent implant step, a greater concentration of dopant is implanted in the source region than in the drain region, thereby providing asymmetrical source/drain doping.

In accordance with one aspect of the invention, a method of making an asymmetrical IGFET and providing a field dielectric between adjacent active regions includes providing a semiconductor substrate with an active region and a field region, wherein the active region includes a source region and a drain region, and the active region is adjacent to the field region, forming a dielectric layer over the substrate, forming a first etch mask over the dielectric layer, etching a selected portion of the dielectric layer beneath an opening in the first etch mask, wherein a first unetched portion of the dielectric layer provides a field dielectric over the field region, a second unetched portion of the dielectric layer provides a drain-protect dielectric over the drain region, and the dielectric layer is removed above the source region, forming a gate insulator on a portion of the active region outside the drain-protect dielectric, depositing a gate material over the drain-protect dielectric and the gate insulator, polishing the gate material so that a portion of the gate material over the drain-protect dielectric is removed, forming a second etch mask over the gate material, etching the gate material beneath an opening in the second etch mask to remove a portion of the gate material over the source region, wherein an unetched portion of the gate material forms a gate, and a sidewall of the gate is adjacent to a sidewall of the drain-protect dielectric, implanting a dopant into the active region during a first implant step, wherein a greater concentration of the dopant is implanted in the source region than in the drain region due to the drain-protect dielectric, and forming a source in the source region and a drain in the drain region.

One variation of the method includes implanting a heavily doped source region into the source region without providing essentially any doping for the drain region using the drain-protect dielectric as an implant mask for the drain region during the first implant step, removing the drain-protect dielectric, and implanting a lightly doped drain region into the drain region during a second implant step. Another variation of the method includes removing an upper portion of the drain-protect dielectric without removing a lower portion of the drain-protect dielectric, and implanting a heavily doped source region into the source region and a lightly doped drain region into the drain region using the lower portion of the drain-protect dielectric as a displacement layer for the drain region during the first implant step.

Preferably, after forming the heavily doped source region and the lightly doped drain region, the method includes forming first and second spacers in close proximity to opposing sidewalls of the gate, wherein the first spacer is over the source region and the second spacer is over the drain region, and implanting an ultra-heavily doped source region into the source region outside the first spacer and a heavily doped drain region into the drain region outside the second spacer. It is also preferred that silicide contacts are formed on the gate, source and drain without forming any silicide on the field region due to the field dielectric.

As exemplary materials, the gate is polysilicon, the gate insulator and dielectric layer are silicon dioxide, the spacers are silicon nitride, the etch masks are photoresist, and the silicide contacts are titanium silicide.

Advantageously, the IGFET has low source-drain resistance and reduces hot carrier effects, and the field dielectric provides dielectric isolation while avoiding numerous problems associated with LOCOS. Another advantage is that a single dielectric layer provides both the field dielectric and the drain-protect dielectric, thereby reducing process steps. Another very significant advantage is that the gate can have an extremely narrow length since its opposing sidewalls are formed in sequence at locations defined by separate photolithography steps. For instance, the length between the sidewalls of the gate can be about 1000 angstroms (0.1 microns), which is far less than the minimum resolution of currently available photolithographic systems.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

Figure 1A:
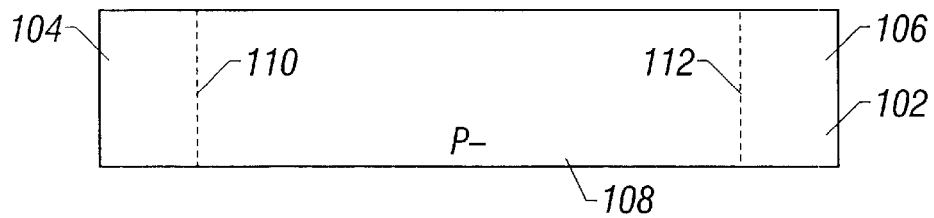
FIGS. 1A–1T show cross-sectional views of successive process steps for making an asymmetrical IGFET in an active region and providing field dielectrics adjacent to the active region in accordance with a first embodiment of the invention.

In the drawings, depicted elements are not necessarily drawn to scale and like or similar elements may be designated by the same reference numeral throughout the several views.

Figure 1B:
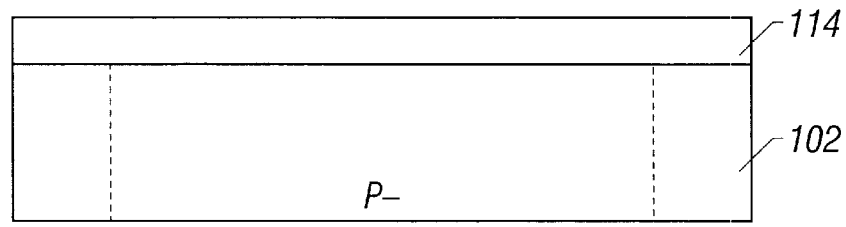
Figure 1C:
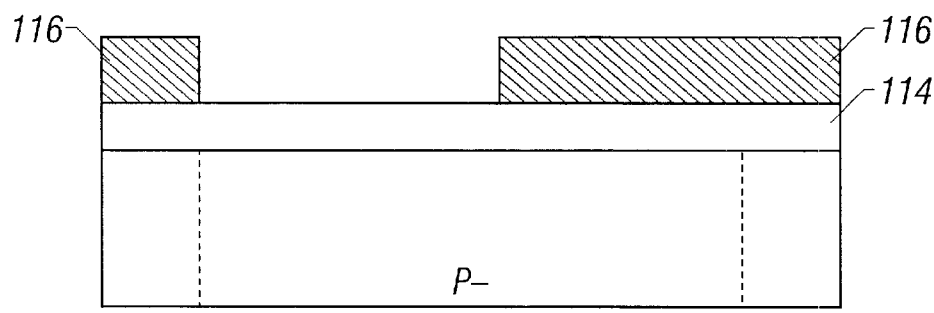
Figure 1D:
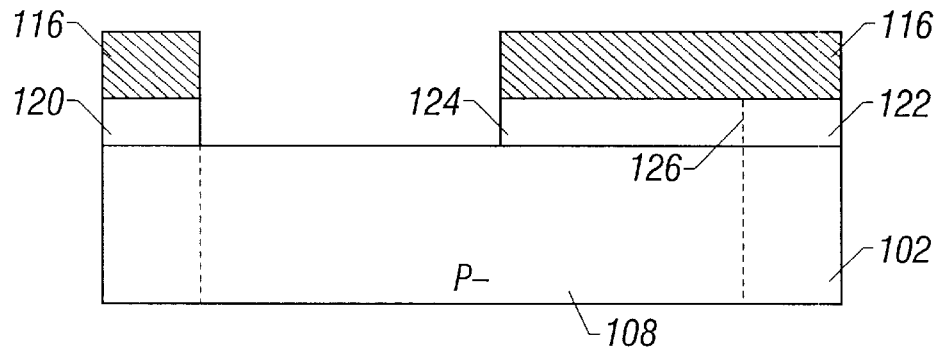
Figure 1E:
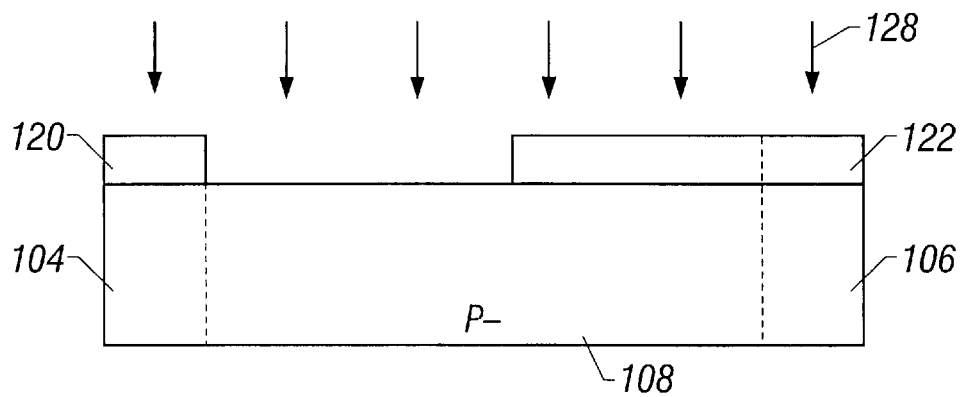
Figure 1F:
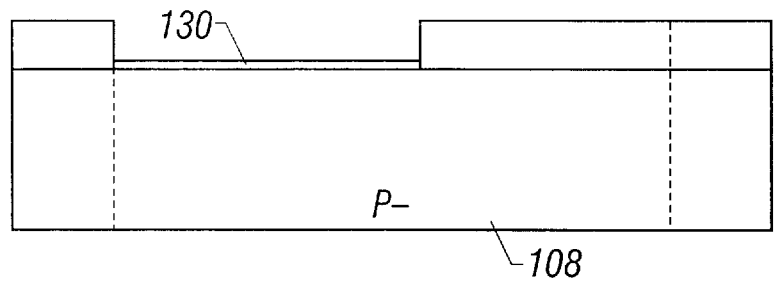
Figure 1G:
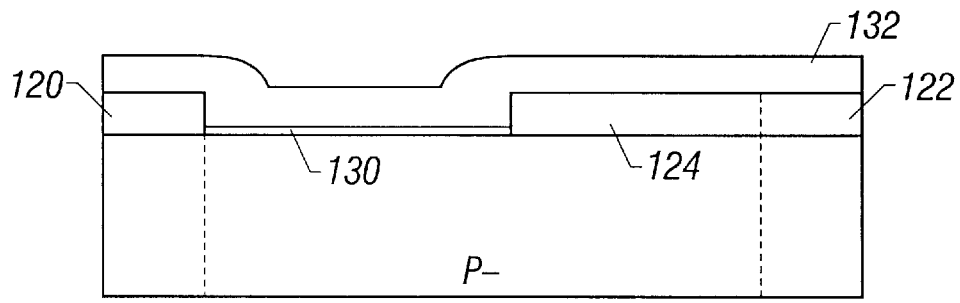
Figure 1H:
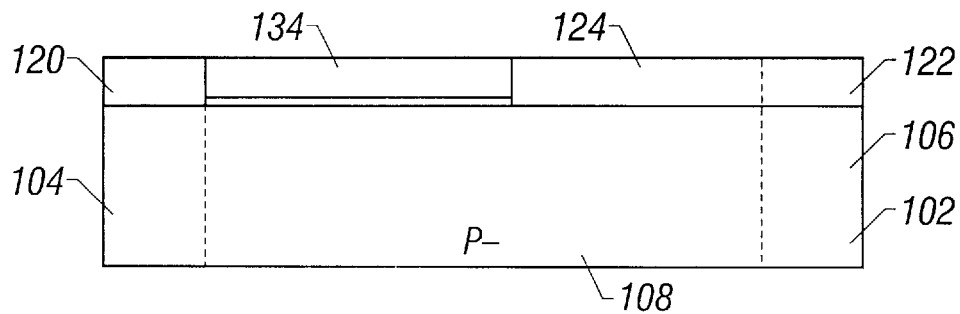
Figure 1I:
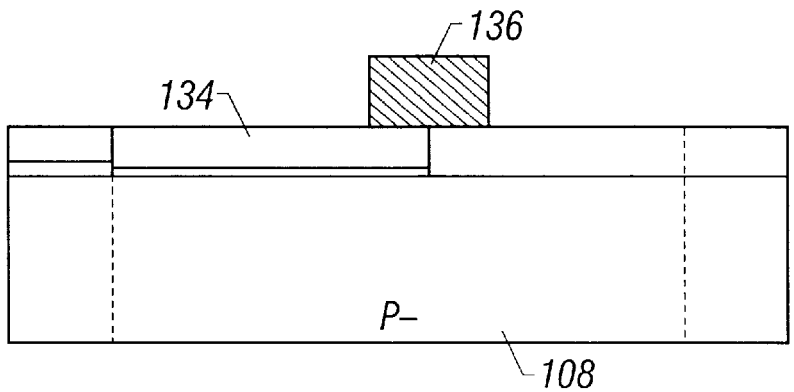
Figure 1J:
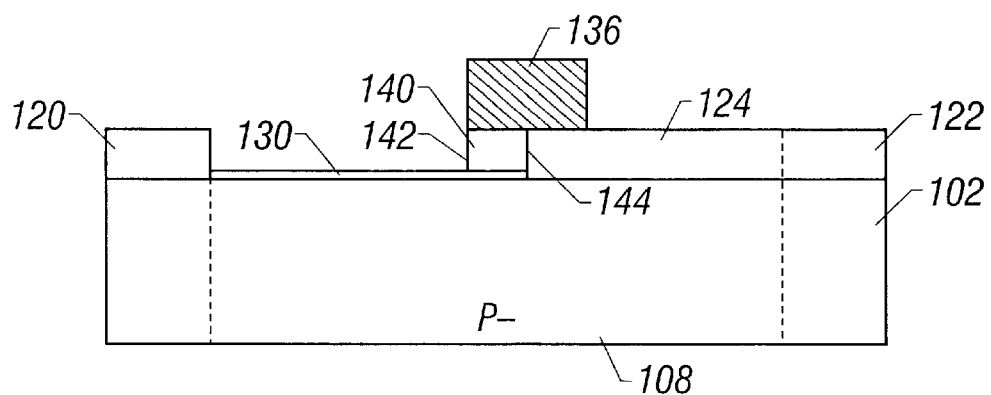
Figure 1K:
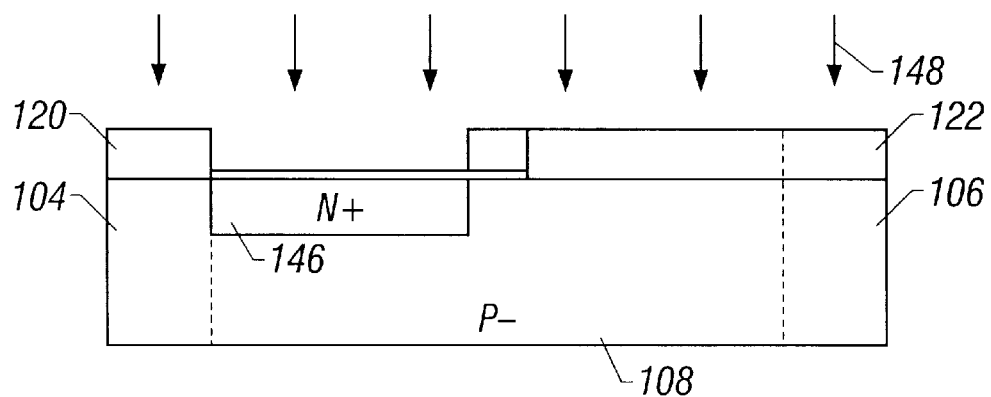
Figure 1L:
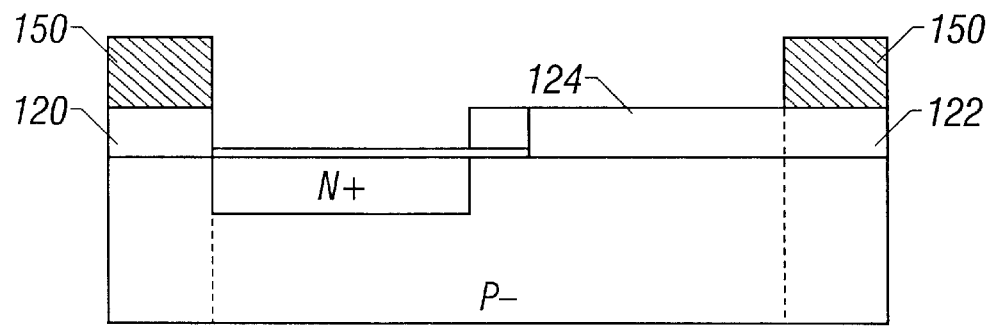
Figure 1M:
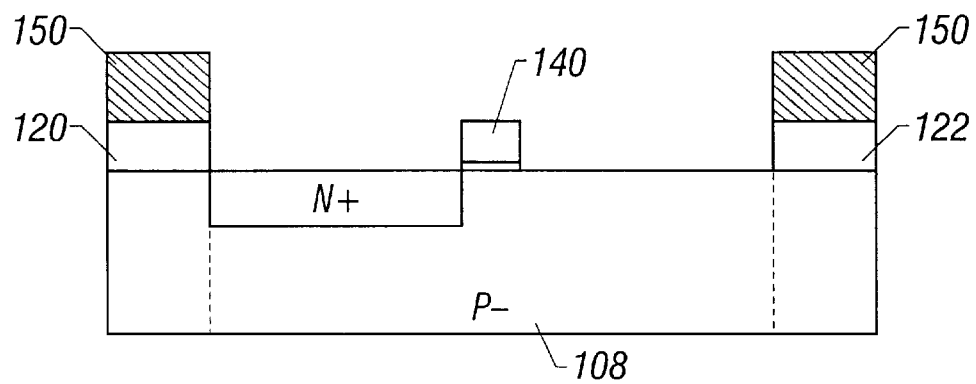
Figure 1N:
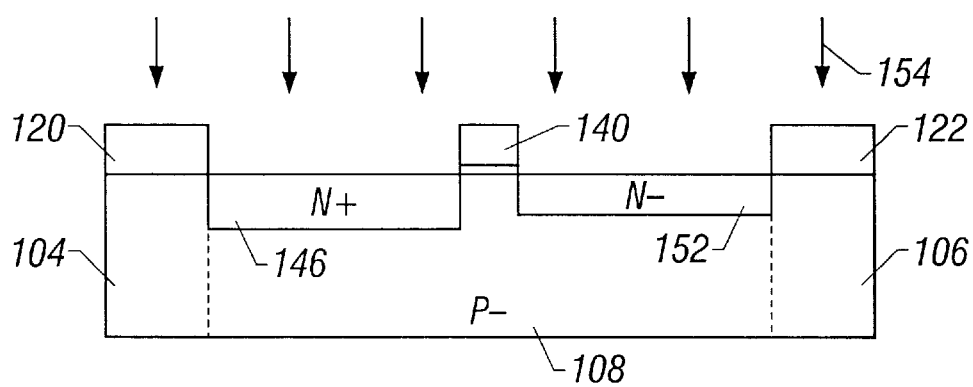
Figure 1O:
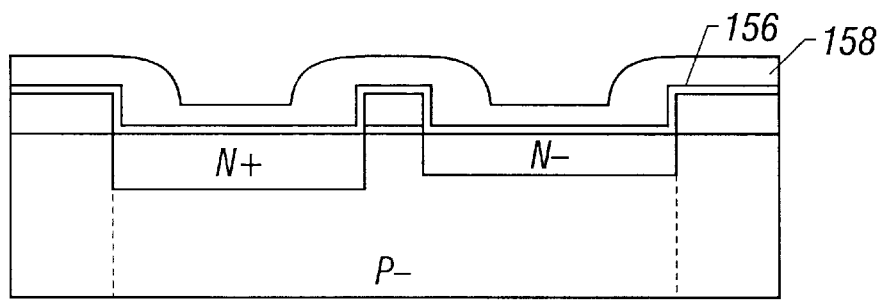
Figure 1P:
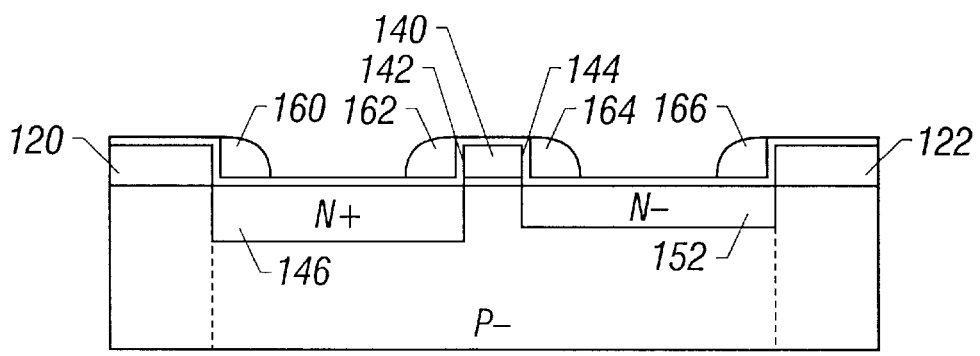
Figure 1Q:
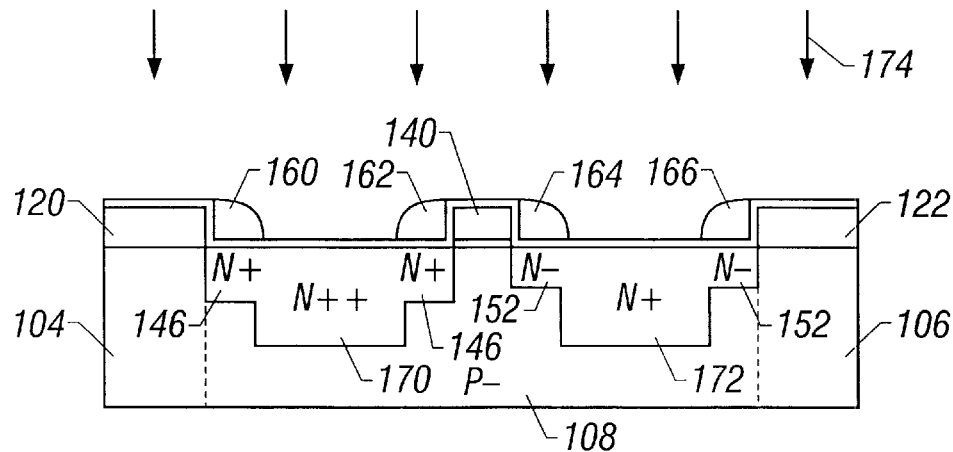
Figure 1R:
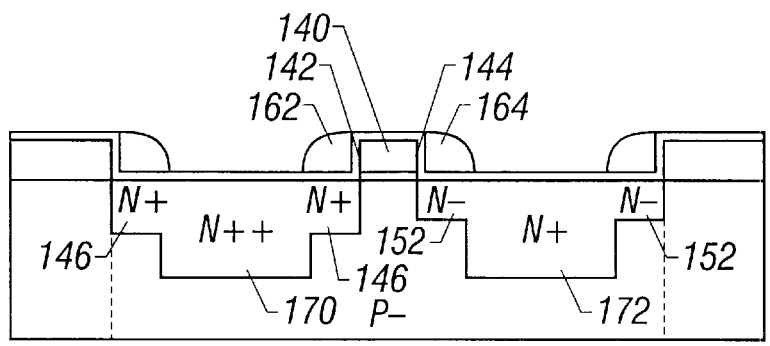
Figure 1S:
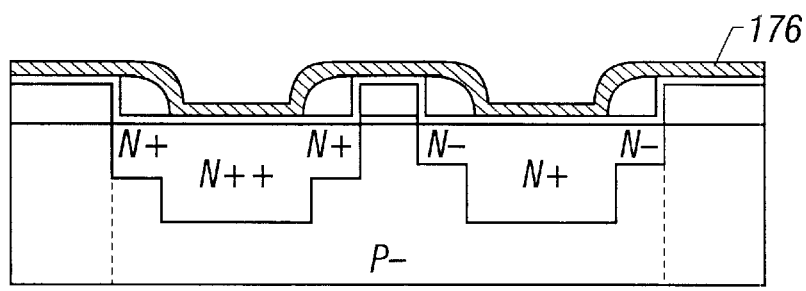
Figure 1T:
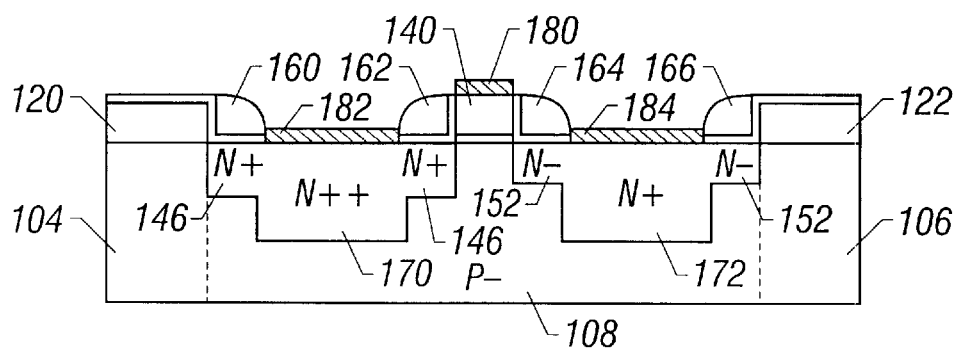

FIGS. 1A–1T show cross-sectional views of successive process steps for making an asymmetrical IGFET in an active region and providing field dielectrics adjacent to the active region in accordance with a first embodiment of the invention.

In FIG. 1A, silicon substrate 102 suitable for integrated circuit manufacture is provided. Substrate 102 includes a P-type epitaxial surface layer disposed on a P+ base layer (not shown). The epitaxial surface layer has a boron background concentration on the order of $1 \times 10^{15}$ atoms/cm$^3$, a <100> orientation and a resistivity of 12 ohm-cm. Substrate 102 includes field regions 104 and 106, and active region 108 therebetween. Broken lines 110 depict the boundary between field region 104 and active region 108, and broken lines 112 depict the boundary between field region 106 and active region 108. Field regions 104 and 106 are between active region 108 and other active regions (not shown) in substrate 102.

In FIG. 1B, oxide layer 114 composed of silicon dioxide (SiO$_2$) with a thickness of 2000 angstroms is conformally deposited on substrate 102 by plasma enhanced chemical vapor deposition (PECVD) from a silane-based source at a temperature in the range of 300 to 450° C. Oxide layer 114 is deposited at a high temperature so that it is dense and provides a high quality insulative structure. After deposition occurs, but before providing a channel-stop implant, oxide layer 114 can be further densified, if necessary, using an anneal (such as a tube anneal or rapid thermal anneal) at a temperature in the range of 800 to 1100° C.

In FIG. 1C, photoresist layer 116 is deposited on oxide layer 114 and patterned to selectively expose oxide layer 114. Photoresist layer 116 is patterned using a photolithographic system, such as a step and repeat optical projection system, in which deep ultraviolet light from a mercury-vapor lamp is projected through a first reticle and a focusing lens to obtain a first image pattern. For illustration purposes, the minimum resolution of the photolithographic system is about 3500 angstroms (0.35 microns). Thereafter, photoresist layer 116 is developed and the irradiated portions are removed. The openings in photoresist layer 116 define field oxides and a drain-protect oxide, as described below.

In FIG. 1D, an anisotropic dry etch is applied using photoresist layer 116 as an etch mask. Photoresist layer 116 protects the underlying regions of oxide layer 114, and the etch removes the regions of oxide layer 114 beneath the openings in photoresist layer 116. The etch is highly selective of silicon dioxide with respect to silicon, so only a negligible amount of substrate 102 beneath the openings in photoresist layer 116 is removed. The etch forms field oxides 120 and 122 and drain-protect oxide 124 from unetched portions of oxide layer 114. As is seen, field oxide 122 and drain-protect oxide 124 are portions of a continuous oxide segment. Broken lines 126 depict the boundary between field oxide 122 and drain-protect oxide 124. Of importance, drain-protect oxide 124 is above a drain region of active region 108, however drain-protect oxide 124 is not above a source region of active region 108.

In FIG. 1E, photoresist layer 116 is removed, and a well/channel-stop implant, punchthrough implant, and threshold adjust implant are applied sequentially into substrate 102. Although these implant steps are collectively represented by arrows 128, it is understood that three implant steps occur separately and in sequence. The well/channel-stop implant is provided by subjecting the structure to ion implantation of boron at a dose in the range of $1 \times 10^{12}$ to $1 \times 10^{13}$ atoms/cm$^2$ and an energy in the range of 100 to 170 kiloelectron-volts, then the punchthrough implant is provided by subjecting the structure to ion implantation of boron at a dose in the range of $1 \times 10^{12}$ to $1 \times 10^{13}$ atoms/cm$^2$ and an energy in the range of 40 to 100 kiloelectron-volts, and then the threshold adjust implant is provided by subjecting the structure to ion implantation of boron at a dose in the range of $1 \times 10^{12}$ to $1 \times 10^{13}$ atoms/cm$^2$ and an energy in the range of 2 to 30 kiloelectron-volts.

In field regions 104 and 106, the well/channel-stop implant functions as a channel-stop implant that is implanted through field oxides 120 and 122 into field regions 104 and 106, respectively, thereby raising the doping concentration in field regions 104 and 106 in order to raise the threshold voltages, which facilitates avoiding parasitic devices in these regions. The punchthrough implant and threshold adjust implant have significantly lower implant energies than the well/channel-stop implant, and therefore are essentially blocked by field oxides 120 and 122.

In active region 108, the well/channel-stop implant functions as a well implant that provides a more uniform background doping, the punchthrough implant provides the channel with greater robustness to punchthrough voltages by laterally widening of the drain-depletion region below the top surface of the substrate, and the threshold adjust implant shifts the threshold voltage towards a desired value such as 0.4 to 0.7 volts. Typically the threshold adjust implant has a peak concentration near the top surface of the substrate, the punchthrough implant has a peak concentration near the bottom of the source and drain regions, and the well/channel-stop implant has a peak concentration below the source and drain regions. Although the punchthrough implant and threshold adjust implant are essentially blocked by drain-protect oxide 124, this does not degrade device performance since these implants are utilized in the channel region. Active region 108 continues to be doped P− with an increased boron background concentration on the order of about $1 \times 10^{16}$ atoms/cm$^3$.

In FIG. 1F, a blanket layer of gate oxide 130, composed of silicon dioxide, is grown on the exposed portion of active region 108, using tube growth at a temperature of 700 to 1000° C. in an $O_2$ containing ambient. Gate oxide 130 has a thickness of about 50 angstroms.

In FIG. 1G, polysilicon layer 132 with a thickness of 2500 angstroms is conformally deposited over the structure by low pressure chemical vapor deposition (LPCVD). Thus, polysilicon layer 132 is deposited on and covers field oxides 120 and 122, drain-protect oxide 124, and gate oxide 130. If desired, polysilicon layer 132 can be doped in situ as deposition occurs, or doped before a subsequent etch step by implanting arsenic with a dosage in the range of $1 \times 10^{15}$ to $5 \times 10^{15}$ atoms/cm$^2$ and an energy in the range of 2 to 10 kiloelectron-volts. However, it is generally preferred that the polysilicon be initially doped at a later step, as described below.

In FIG. 1H, the structure is planarized by applying chemical-mechanical polishing in the presence of an abrasive slurry that is highly selective of polysilicon with respect to silicon dioxide. The polishing grinds down polysilicon layer 132, and is discontinued using field oxides 120 and 122 and drain-protect oxide 124 as a stop-layer. Thus, polysilicon layer 132 is completely removed above field oxides 120 and 122. The remaining portion of polysilicon layer 132 above active region 108 forms polysilicon segment 134. As is seen, the top surfaces of field oxides 120 and 122, drain-protect oxide 124 and polysilicon segment 134 are aligned and form a planar surface. Polysilicon segment 134 and field oxide 120 have adjacent sidewalls, as do polysilicon segment 134 and field oxide 122. However, polysilicon segment 134 does not contact substrate 102 or overlap field regions 104 or 106.

In FIG. 1I, photoresist layer 136 is deposited over the structure and patterned to selectively expose polysilicon segment 134. The photolithographic system uses a second reticle to irradiate photoresist layer 136 with a second image pattern, the irradiated portions of photoresist layer 136 are removed, and photoresist layer 136 includes an opening above a portion of active region 108 that defines one sidewall of a gate, as described below.

In FIG. 1J, an anisotropic dry etch is applied using photoresist layer 136 as an etch mask. Photoresist layer 136 protects the underlying region of polysilicon segment 134, and the etch removes the region of polysilicon segment 134 beneath the opening in photoresist layer 136. The etch is highly selective of polysilicon with respect to silicon dioxide, so only a negligible amount of silicon dioxide is removed and substrate 102 is unaffected. The etch forms polysilicon gate 140 from the unetched portion of polysilicon segment 134. Gate 140 has opposing vertical sidewalls 142 and 144 separated by a length of about 1000 angstroms, and a thickness (or height above the underlying gate oxide 130) of about 1950 angstroms. Sidewall 142 is defined by photoresist layer 136, whereas sidewall 144 is adjacent to drain-protect oxide 124 and was previously defined by photoresist layer 116. Therefore, gate 140 has a length that is not constrained by, and is far smaller than, the minimum resolution of the photolithographic system. Sidewall 142 and field oxide 120 are separated by about 3000 angstroms, and sidewall 144 and field oxide 122 are separated by about 3000 angstroms. It should also be noted that the source region of active region 108 extends to the left of gate 140 and is substantially aligned with sidewall 142, and the drain region of active region 108 extends to the right of gate 140 and is substantially aligned with sidewall 144.

In FIG. 1K, photoresist layer 136 is removed, and heavily doped source region 146 is implanted into the source region of active region 108 by subjecting the structure to ion implantation of arsenic, indicated by arrows 148, at a dose in the range of $2 \times 10^{15}$ to $4.5 \times 10^{15}$ atoms/cm$^2$ and an implant energy of 2 to 10 kiloelectron-volts, using field oxides 120 and 122 as implant masks for field regions 104 and 106, respectively, and using drain-protect oxide 124 and gate 130 as an implant mask for active region 108. As a result, heavily doped source region 146 is substantially aligned with sidewall 142 and forms a shallow channel junction, and the drain region is essentially unaffected. Heavily doped source region 146 is doped N+ with an arsenic concentration in the range of about $1 \times 10^{18}$ to $1 \times 10^{20}$ atoms/cm$^3$, and the drain region remains doped P−.

In FIG. 1L, photoresist layer 150 is deposited over the structure and patterned to expose active region 108. The photolithographic system uses a third reticle to irradiate photoresist layer 150 with a third image pattern, the irradiated portions of photoresist layer 150 are removed, photoresist layer 150 covers field oxides 120 and 122, and photoresist layer 150 includes an opening above drain-protect oxide 124.

In FIG. 1M, an anisotropic dry etch is applied using photoresist layer 150 as an etch mask. Photoresist layer 150 protects field oxides 120 and 122, and the etch removes drain-protect oxide 124 and the region of gate oxide 130 outside gate 140. The etch is highly selective of silicon dioxide with respect to silicon, so only a negligible amount of gate 140 and active region 108 outside gate 140 is removed.

In FIG. 1N, photoresist layer 150 is removed, and lightly doped drain region 152 is implanted into the drain region of active region 108 by subjecting the structure to ion implantation of phosphorus, indicated by arrows 154, at a dose in the range of $1 \times 10^{13}$ to $5 \times 10^{14}$ atoms/cm$^2$ and an implant energy of about 2 to 10 kiloelectron-volts, using field oxides 120 and 122 as implant masks for field regions 104 and 106, respectively, and using gate 140 alone as an implant mask for active region 108. As a result, lightly doped drain region 152 is substantially aligned with sidewall 144 and forms a shallow channel junction. Since the phosphorus (indicated by arrows 154) is implanted with a far smaller dosage than the arsenic (indicated by arrows 148), the phosphorus has no appreciable affect on heavily doped source region 146. Lightly doped drain region 152 is doped N− with a phosphorus concentration in the range of about $1 \times 10^{17}$ to $1 \times 10^{18}$ atoms/cm$^3$, and heavily doped source region 146 remains doped N+.

In FIG. 1O, oxide layer 156 composed of silicon dioxide with a thickness of about 50 angstroms is conformally deposited over the exposed surfaces by plasma enhanced chemical vapor deposition (PECVD) at a temperature in the range of 350 to 450° C. Thereafter, nitride layer 158 composed of silicon nitride (Si$_3$N$_4$) with a thickness of about 1500 angstroms is conformally deposited on oxide layer 156 by plasma enhanced chemical vapor deposition (PECVD) at a temperature in the range of 200 to 400° C.

In FIG. 1P, nitride layer 158 is subjected to an anisotropic etch, such as a reactive ion etch, that is highly selective of silicon nitride with respect to silicon dioxide. The anisotropic etch forms nitride spacers 160 and 162 over heavily doped source region 146 and nitride spacers 164 and 166 over lightly doped drain region 152 from the unetched portions of nitride layer 158. Nitride spacers 160 and 166 are in close proximity to the sidewalls of field oxides 120 and 122, respectively, and nitride spacers 162 and 164 are in close proximity to sidewalls 142 and 144, respectively, of gate 140. Furthermore, oxide layer 156 protects gate 140, and the portions of heavily doped source region 146 and lightly doped drain region 152 between the nitride spacers, from the nitride etch.

In FIG. 1Q, ultra-heavily doped source region 170 and heavily doped drain region 172 are implanted into the source region and drain region, respectively, of active region 108, by subjecting the structure to ion implantation of arsenic, indicated by arrows 174, at a dose in the range of $1 \times 10^{15}$ to $5 \times 10^{15}$ atoms/cm$^2$ and an implant energy of 20 to 80 kiloelectron-volts, using field oxides 120 and 122 as implant masks for field regions 104 and 106, respectively, and using gate 140 and nitride spacers 160, 162, 164 and 166 (and the vertical portions of oxide layer 156 between gate 140 and nitride spacers 162 and 164) as an implant mask for active region 108. As a result, ultra-heavily doped source region 170 is substantially aligned with the curved edges of nitride spacers 160 and 162, and heavily doped drain region 172 is substantially aligned with the curved edges of nitride spacers 164 and 166. Ultra-heavily doped source region 170 is doped N++ with an arsenic concentration in the range of about $1.5 \times 10^{19}$ to $1 \times 10^{21}$ atoms/cm$^3$, and heavily doped drain region 172 is doped N+ with an arsenic concentration in the range of about $1 \times 10^{18}$ to $1 \times 10^{20}$ atoms/cm$^3$. Furthermore, the portions of heavily doped source region 146 beneath nitride spacers 160 and 162 are essentially unaffected and remain doped N+, and the portions of lightly doped drain region 152 beneath nitride spacers 164 and 166 are essentially unaffected and remain doped N−.

The depths of ultra-heavily doped source region 170 and heavily doped drain region 172 are greater than the depths of heavily doped source region 146 and lightly doped drain region 152, and ultra-heavily doped source region 170 and heavily doped drain region 172 are displaced from the channel junctions provided by heavily doped source region 146 and lightly doped drain region 152 beneath nitride spacers 162 and 164, respectively.

In FIG. 1R, the device is annealed to remove crystalline damage and to drive-in and activate the implanted dopants by applying a rapid thermal anneal on the order of 950 to 1050° C. for 10 to 30 seconds. During high-temperature processing, phosphorus diffuses far more rapidly than arsenic in single crystal silicon. As a result, heavily doped source region 146 and lightly doped drain region 152 diffuse farther than ultra-heavily doped source region 170 and heavily doped drain region 172. Nevertheless, since the rapid thermal anneal is very brief, the channel junction provided by heavily doped source region 146 beneath nitride spacer 162 remains substantially aligned with sidewall 142, and the channel junction provided by lightly doped drain region 152 beneath nitride spacer 164 remains substantially aligned with sidewall 144. In this manner, an N-channel IGFET is formed with a source (consisting of heavily and ultra-heavily doped source regions 146 and 170) in the source region and a drain (consisting of lightly and heavily doped drain regions 152 and 172) in the drain region. The IGFET is controlled by gate 140.

In FIG. 1S, titanium layer 176 with a thickness of about 300 angstroms is sputter deposited over the structure.

In FIG. 1T, a rapid thermal anneal on the order of 700° C. for 30 seconds is applied in a nitrogen ambient to convert portions of titanium layer 176 over gate 140, ultra-heavily doped source region 170 and heavily doped drain region 172 into titanium silicide contacts 180, 182 and 184, respectively. It is noted that about 350 angstroms of oxide between the titanium and the underlying silicon is sufficiently thick to prevent the silicide reaction from occurring. Of importance, field oxides 120 and 122 are thick enough to prevent silicide formation on field regions 104 and 106, respectively, thereby preventing unwanted silicide bridges between active region 108 and neighboring active regions (not shown). Furthermore, nitride spacers 160 and 162 protect heavily doped source region 146 from the silicide reaction, and nitride spacers 164 and 166 protect lightly doped drain region 152 from the silicide reaction. However, the portions of oxide layer 156 on gate 140, ultra-heavily doped source region 170 and heavily doped drain region 172 that contact titanium layer 176 are thin enough to be consumed by the silicide reaction and permit silicide formation on the underlying regions. Thereafter, the unreacted titanium (including titanium nitride) is stripped, and a subsequent rapid thermal anneal at 750 to 800° C. for 30 seconds is applied to lower the resistivity of titanium silicide contacts 180, 182 and 184.

Figure 2A:
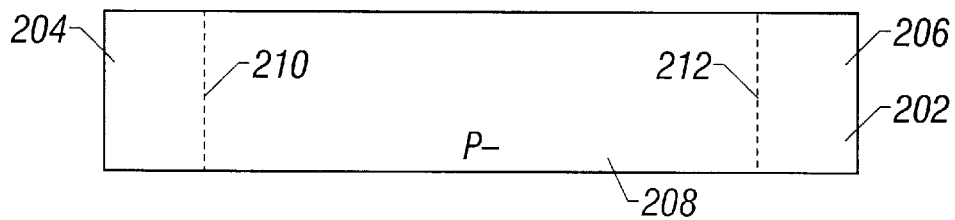
FIGS. 2A–2T show cross-sectional views of successive process steps for making an asymmetrical IGFET in an active region and providing field dielectrics adjacent to the active region in accordance with a second embodiment of the invention.
Figure 2B:
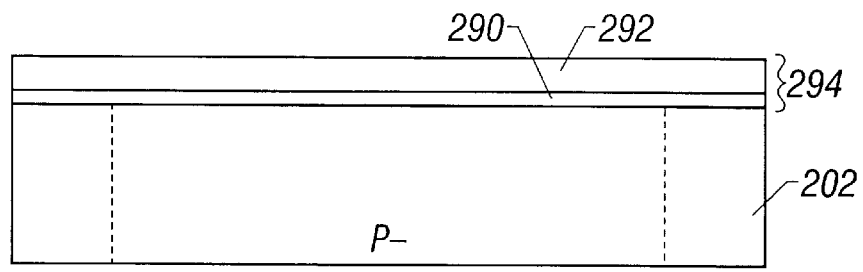
Figure 2C:
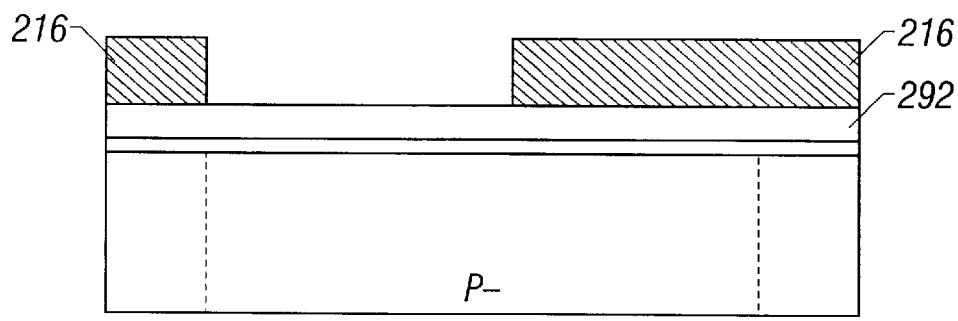
Figure 2D:
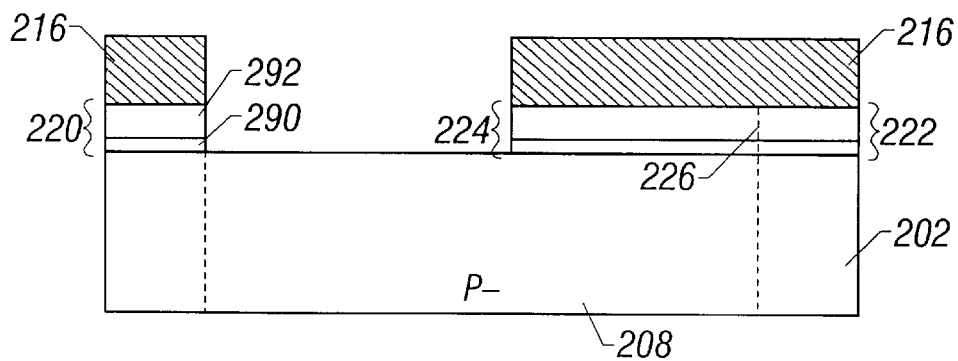
Figure 2E:
Figure 2E:
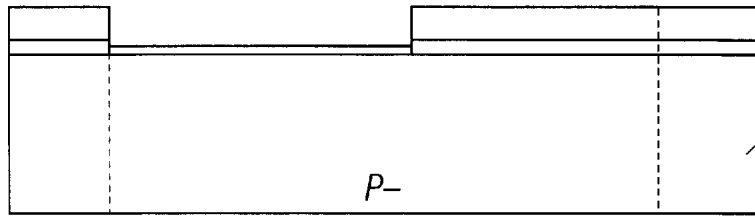
Figure 2F:
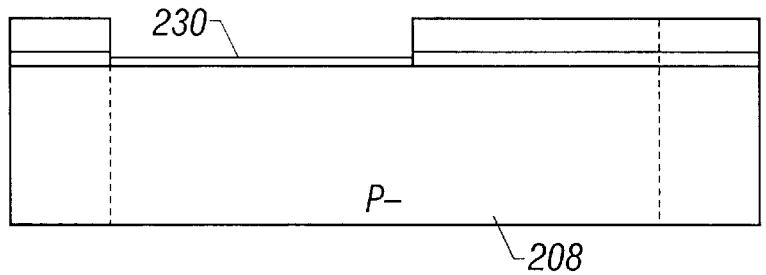
Figure 2G:
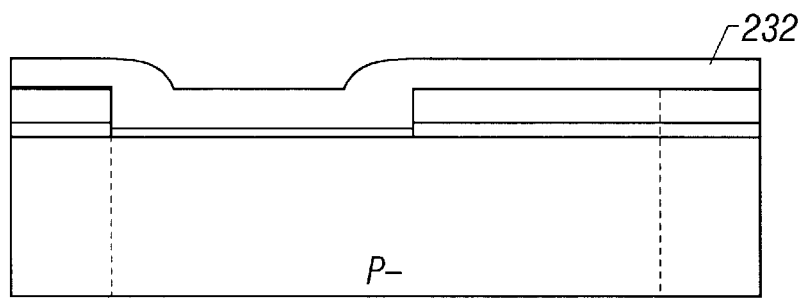
Figure 2H:
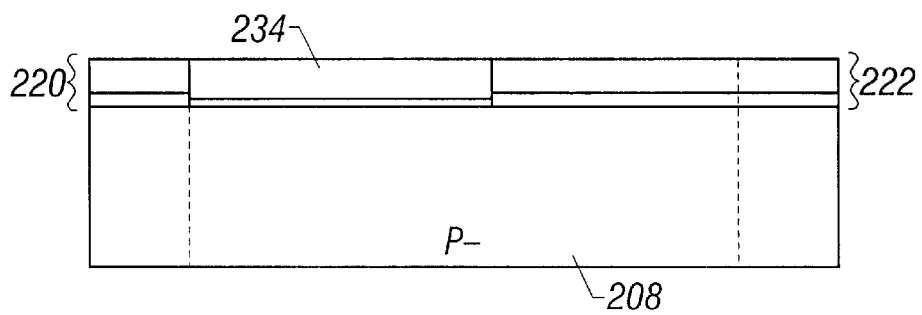
Figure 2I:
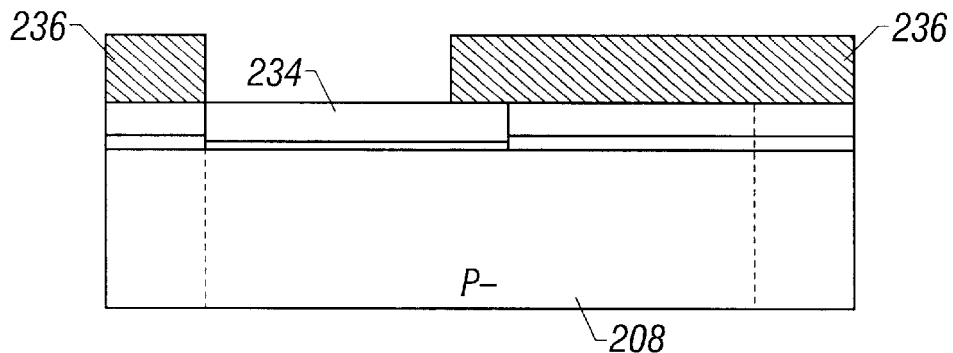
Figure 2J:
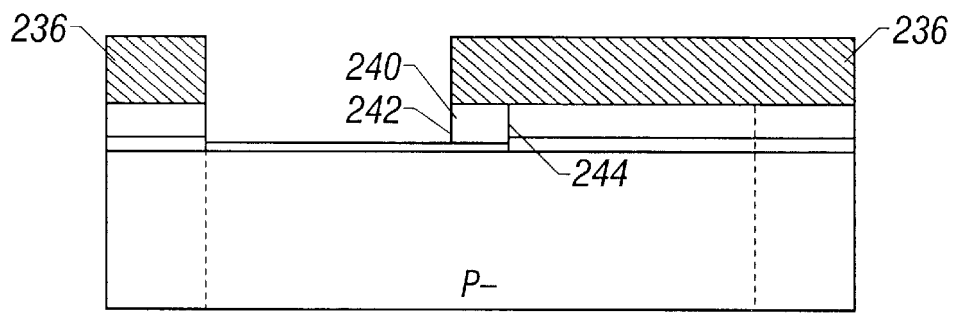
Figure 2K:
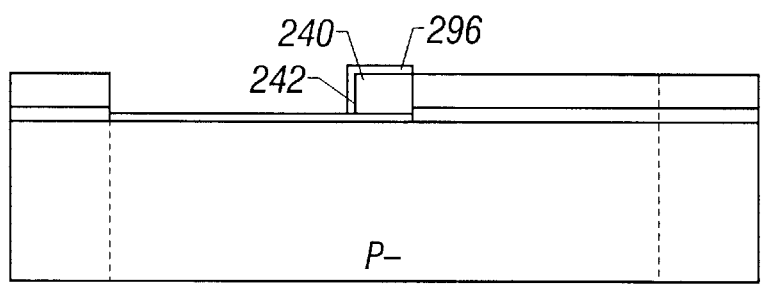
Figure 2L:
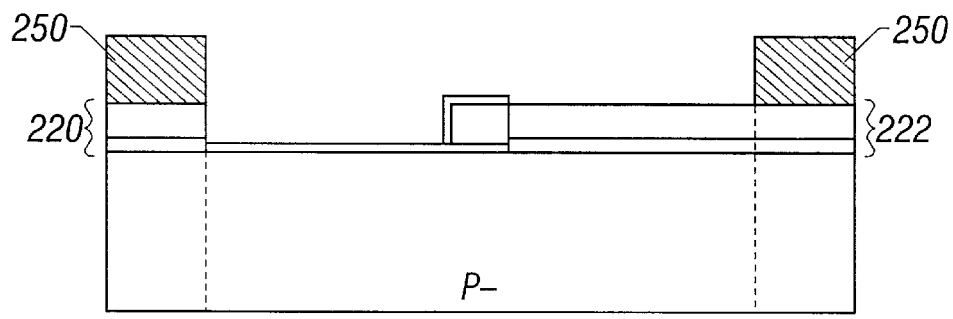
Figure 2M:
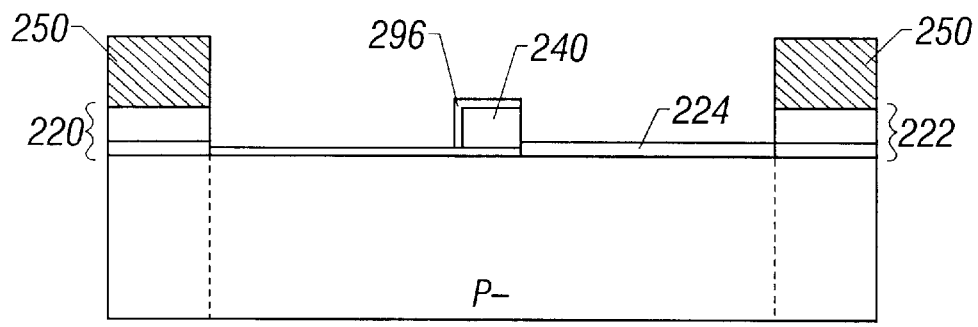
Figure 2N:
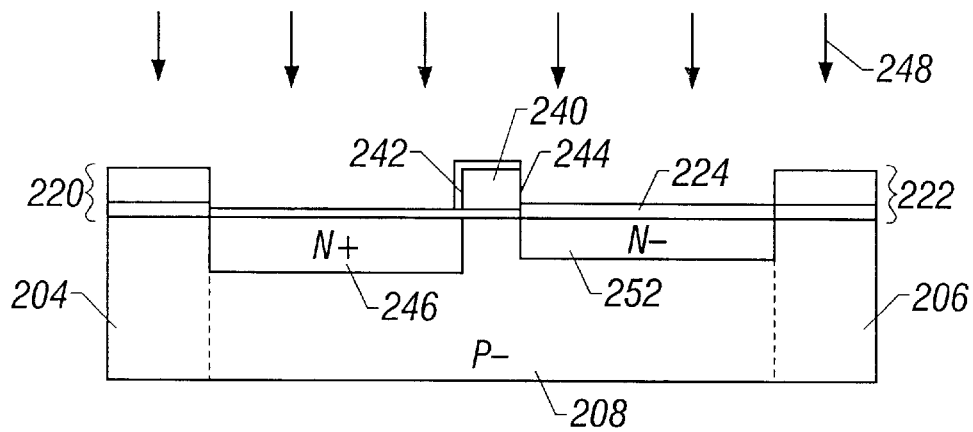
Figure 2O:
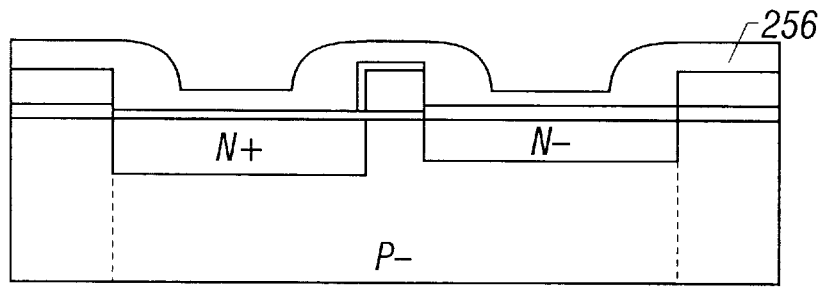
Figure 2P:
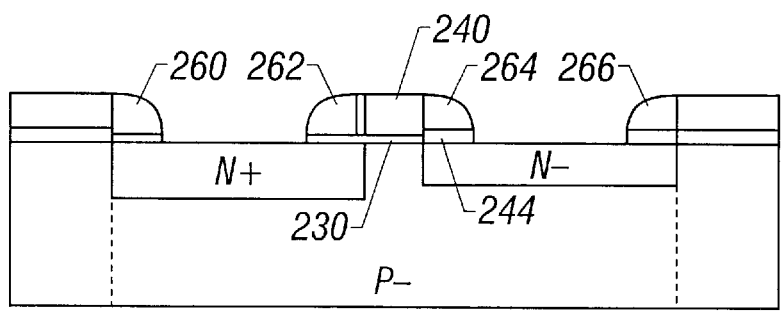
Figure 2Q:
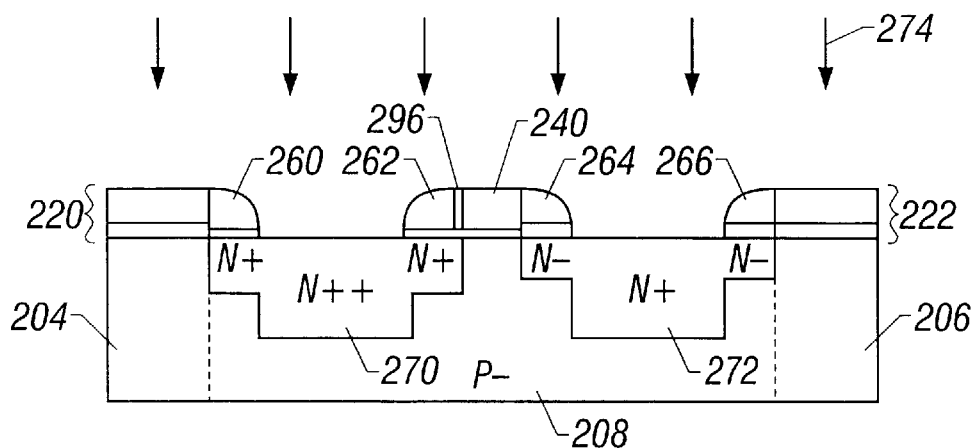
Figure 2R:
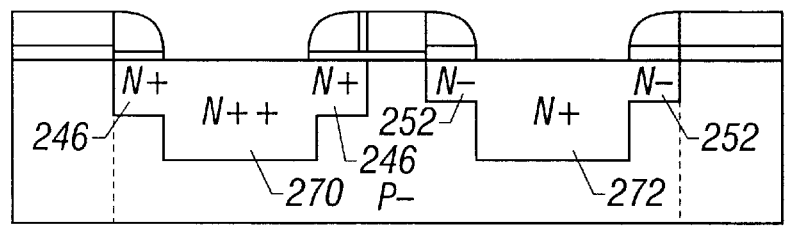
Figure 2S:
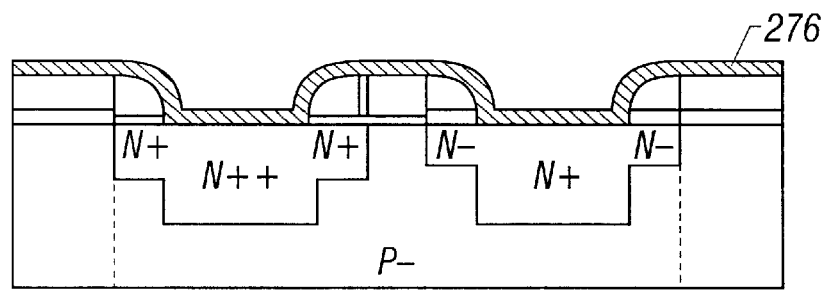
Figure 2T:
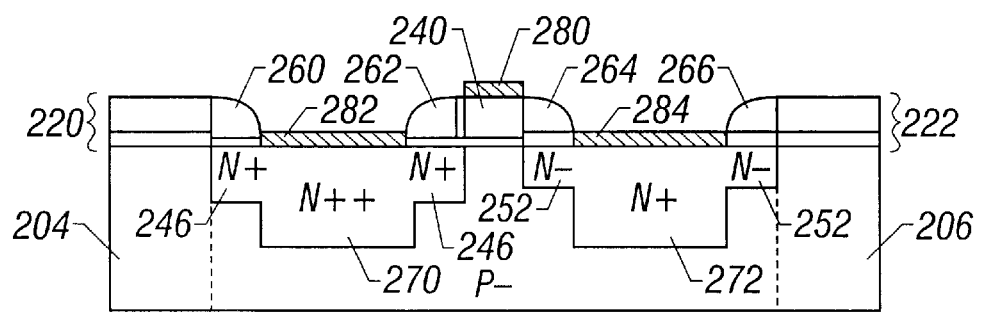

FIGS. 2A–2T show cross-sectional views of successive process steps for making an asymmetrical IGFET in an active region and providing field dielectrics adjacent to the active region in accordance with a second embodiment of the invention. In the first embodiment, the heavily doped source region which provides the source-side channel junction is doped with arsenic during a first implant step, and the lightly doped drain region which provides the drain-side channel junction is doped with phosphorus during a second implant step. It is often desirable to minimize diffusion of the channel junctions. Although phosphorus diffuses far more rapidly than arsenic in single crystal silicon during high-temperature steps, a phosphorus-based lightly doped drain region may provide better protection against hot carrier effects than an arsenic-based lightly doped drain region. Therefore, doping the heavily doped source region primarily with arsenic and the lightly doped drain region primarily with phosphorus is desirable.

It is also desirable to reduce the number of process steps whenever possible. In the second embodiment, the heavily doped source region and the lightly doped drain region are implanted into the active region using a single implant step. Therefore, the second embodiment requires fewer implant steps than the first embodiment. However, since the second embodiment implants the same dopant into the heavily doped source region and the lightly doped drain region, the second embodiment foregoes the advantage of doping the heavily doped source region primarily with arsenic and the lightly doped drain region primarily with phosphorus. Furthermore, in the second embodiment, there are tradeoffs between doping the heavily doped source region and the lightly doped drain region with arsenic or with phosphorus. As mentioned above, phosphorus may provide better protection against hot carrier effects, but phosphorus may also exhibit excessive diffusion, particularly by the heavily doped source region. The overlap between the channel junctions and the gate leads to capacitive effects (known as "Miller capacitance") that tend to reduce switching speeds, however decreasing the channel length increases drive current. Therefore, the overlap between the gate and the channel junctions involves a tradeoff between switching speed and drive current. For illustration purposes, in the second embodiment, the heavily doped source region and the lightly doped drain region are doped with arsenic, although other dopants are suitable.

A primary difference between the first embodiment and the second embodiment is that in the first embodiment, the drain-protect dielectric provides an implant mask which blocks essentially all of the ions impinging upon it, whereas in the second embodiment, an upper portion of the drain-protect dielectric is removed so that a lower portion of the drain-protect dielectric provides a displacement layer that blocks most of the ions impinging upon it, but permits a substantial amount of the ions impinging upon it to pass through into the drain region. Thus, the second embodiment does not require a separate implant step to form the lightly doped drain region. Another difference is that in the first embodiment, the dielectric layer which provides the field dielectrics and the drain-protect dielectric consists of silicon dioxide, whereas in the second embodiment, the dielectric layer consists of silicon nitride on silicon dioxide, the silicon nitride forms the upper portion of the drain-protect dielectric which is removed, and the silicon dioxide forms the lower portion of the drain-protect dielectric which provides the displacement layer. Still another difference is that in the first embodiment nitride spacers are formed, whereas in the second embodiment oxide spacers are formed.

Other differences between the first and second embodiments will be apparent. Unless otherwise noted, the elements for the second embodiment (e.g., substrate 202, field regions 204 and 206, active region 208, etc.) are similar to elements of the first embodiment (e.g., substrate 102, field regions 104 and 106, active region 108, etc.), and the description of related elements and process steps need not be repeated.

In FIG. 2A, silicon substrate 202 suitable for integrated circuit manufacture is provided. Substrate 202 includes field regions 204 and 206, and active region 208 therebetween. Broken lines 210 depict the boundary between field region 204 and active region 208, and broken lines 212 depict the boundary between field region 206 and active region 208.

In FIG. 2B, oxide layer 290 composed of silicon dioxide with a thickness of about 200 angstroms is conformally deposited on substrate 202 by plasma enhanced chemical vapor deposition (PECVD) from a silane-based source at a temperature in the range of 300 to 450° C. Oxide layer 290 is deposited at a high temperature so that it is dense and provides a high quality insulative structure. After deposition occurs, but before providing a channel-stop implant, oxide layer 290 can be further densified, if necessary, using an anneal (such as a tube anneal or rapid thermal anneal) at a temperature in the range of 800 to 1100° C. Thereafter, nitride layer 292 composed of silicon nitride with a thickness of about 1800 angstroms is conformally deposited on substrate oxide layer 290 by plasma enhanced chemical vapor deposition (PECVD) at a temperature in the range of 350 to 800° C. Nitride layer 292 is deposited at a high temperature so that it is dense and provides a high quality insulative structure. After deposition occurs, but before providing a channel-stop implant, nitride layer 292 can be further densified, if necessary, using an anneal (such as a tube anneal or rapid thermal anneal) at a temperature in the range of 800 to 1150° C. Oxide layer 290 and nitride layer 292, in combination, form dielectric layer 294 with a thickness of 2000 angstroms.

In FIG. 2C, photoresist layer 216 is deposited on nitride layer 292 and patterned to selectively expose nitride layer 292. The openings in photoresist layer 216 define field dielectrics and a drain-protect dielectric.

In FIG. 2D, an anisotropic dry etch is applied using photoresist layer 216 as an etch mask. Initially, the etch is highly selective of silicon nitride with respect to silicon dioxide and removes the exposed portions of nitride layer 292 beneath the openings in photoresist layer 216 with appreciably affecting oxide layer 290. Thereafter, the etch chemistry changes so that the etch becomes highly selective of silicon dioxide with respect to silicon nitride and silicon, and the etch removes the exposed portions of oxide layer 290 beneath the openings in photoresist layer 216 without appreciably affecting nitride layer 292 or substrate 202. The etch forms field dielectrics 220 and 222 and drain-protect dielectric 224 from unetched portions of oxide layer 290 and nitride layer 292. As is seen, field dielectric 222 and drain-protect dielectric 224 are portions of a continuous segment of oxide layer 290 and nitride layer 292. Broken lines 226 depict the boundary between field dielectric 222 and drain-protect dielectric 224. Drain-protect dielectric 224 is above a drain region of active region 208, however drain-protect dielectric 224 is not above a source region of active region 208.

In FIG. 2E, photoresist layer 216 is removed, and a well/channel-stop implant, punchthrough implant, and threshold adjust implant, collectively represented by arrows 228, are applied sequentially into substrate 202.

In FIG. 2F, gate oxide 230 is grown on the exposed portion of active region 208.

In FIG. 2G, polysilicon layer 232 is conformally deposited over the structure by low pressure chemical vapor deposition (LPCVD).

In FIG. 2H, the structure is planarized by applying chemical-mechanical polishing in the presence of an abrasive slurry that is highly selective of polysilicon with respect to silicon dioxide. Polysilicon layer 232 is completely removed above field dielectrics 220 and 222, and the remaining portion of polysilicon layer 232 above active region 208 forms polysilicon segment 234. The top surfaces of field dielectrics 220 and 222, drain-protect dielectric 224 and polysilicon segment 234 are aligned and form a planar surface, and polysilicon segment 234 has opposing sidewalls adjacent to sidewalls of field dielectrics 220 and 222.

In FIG. 2I, photoresist layer 236 is deposited over the structure and patterned to selectively expose polysilicon segment 234. Photoresist layer 236 includes an opening above a portion of active region 208 that defines one sidewall of a gate.

In FIG. 2J, an anisotropic dry etch is applied that is highly selective of polysilicon with respect to silicon dioxide using photoresist layer 236 as an etch mask. The etch forms polysilicon gate 240 from the unetched portion of polysilicon segment 234. Gate 240 has opposing vertical sidewalls 242 and 244, and sidewall 244 is adjacent to drain-protect dielectric 224.

In FIG. 2K, photoresist layer 236 is removed, and gate-protect oxide 296 with a thickness of about 50 angstroms is thermally grown on the top surface and sidewall 242 of gate 240.

In FIG. 2L, photoresist layer 250 is deposited over the structure and patterned to cover field dielectrics 220 and 222 and include an opening above drain-protect dielectric 224.

In FIG. 2M, an anisotropic dry etch is applied which is highly selective of silicon nitride with respect to silicon dioxide using photoresist layer 250 as an etch mask. Photoresist layer 250 protects the upper nitride portions of field dielectrics 220 and 222, gate-protect oxide 296 protects gate 240, and the etch removes the upper nitride portion (i.e., nitride layer 292) of drain-protect dielectric 224. Therefore, after etching occurs, drain-protect dielectric 224 consists of the lower oxide portion (i.e., oxide layer 290) with a thickness of about 200 angstroms.

In FIG. 2N, photoresist layer 250 is removed, heavily doped source region 246 is implanted into the source region of active region 208 and lightly doped drain region 252 is implanted into the drain region of active region 208 by subjecting the structure to ion implantation of arsenic, indicated by arrows 248, at a dose in the range of $2 \times 10^{15}$ to $4.5 \times 10^{15}$ atoms/cm$^2$ and an implant energy of about 60 kiloelectron-volts, using field dielectrics 220 and 222 as implant masks for field regions 204 and 206, respectively, using gate 240 as an implant mask for active region 208, and using the lower oxide portion of drain-protect dielectric 224 as a displacement layer for active region 208. That is, although a peak concentration of the arsenic is implanted into the lower oxide portion of drain-protect dielectric 224, a substantial amount of the arsenic is implanted through the lower oxide portion of drain-protect dielectric 224 into active region 208. As a result, heavily doped source region 246 is doped N+ and is substantially aligned with sidewall 242, and lightly doped drain region 252 is doped N− and is substantially aligned with sidewall 244. Furthermore, heavily doped source region 246 has a greater depth than lightly doped drain region 252.

In FIG. 2O, oxide layer 256 composed of silicon dioxide with a thickness of about 1500 angstroms is conformally deposited over the exposed surfaces by plasma enhanced chemical vapor deposition (PECVD) at a temperature in the range of 350 to 450° C.

In FIG. 2P, oxide layer 256 is subjected to an anisotropic etch that is highly selective of silicon dioxide with respect to silicon nitride and silicon, thereby forming oxide spacers 260, 262, 264 and 266. The etch also removes gate-protect oxide 296 over gate 240, the portions of gate oxide 230 between oxide spacers 260 and 262, and the portions of drain-protect dielectric 224 between spacers 264 and 266.

In FIG. 2Q, ultra-heavily doped source region 270 and heavily doped drain region 272 are implanted into the source region and drain region, respectively, of active region 208, by subjecting the structure to ion implantation of arsenic, indicated by arrows 274, using field oxides 220 and 222 as implant masks for field regions 204 and 206, respectively, and using the gate 240 and oxide spacers 260, 262, 264 and 266 (and the vertical portion of gate-protect oxide 296 between gate 240 and oxide spacer 262) as an implant mask for active region 208. Ultra-heavily doped source region 270 is doped N++, and heavily doped drain region 272 is N+.

In FIG. 2R, the device is annealed to remove crystalline damage and to drive-in and activate the implanted dopants by applying a rapid thermal anneal on the order of 950 to 1050° C. for 10 to 30 seconds. In this manner, an N-channel IGFET is formed with a source (consisting of heavily and ultra-heavily doped source regions 246 and 270) in the source region and a drain (consisting of lightly and heavily doped drain regions 252 and 272) in the drain region. The IGFET is controlled by gate 240.

In FIG. 2S, titanium layer 276 is sputter deposited over the structure.

In FIG. 2T, a rapid thermal anneal is applied to convert portions of titanium layer 276 over gate 240, ultra-heavily doped source region 270 and heavily doped drain region 272 into titanium silicide contacts 280, 282 and 284, respectively. Of importance, field oxides 220 and 222 are thick enough to prevent silicide formation on field regions 204 and 206. Furthermore, oxide spacers 260 and 262 protect heavily doped source region 246 from the silicide reaction, and oxide spacers 264 and 266 protect lightly doped drain region 252 from the silicide reaction. In addition, any native oxide or unetched oxide on gate 240, ultra-heavily doped source region 270 and heavily doped drain region 272 that contacts titanium layer 276 is thin enough to be consumed by the silicide reaction and permit silicide formation on the underlying regions. Thereafter, the unreacted titanium (including titanium nitride) is stripped, and a subsequent rapid thermal anneal is applied to lower the resistivity of titanium silicide contacts 280, 282 and 284.

Accordingly, the present invention provides an asymmetrical IGFET. Preferably, a heavily doped source region and a lightly doped drain region provide the channel junctions, and an ultra-heavily doped source region and a heavily doped drain region are displaced from the channel junctions.

By definition, the dopant concentration of the ultra-heavily doped source region exceeds that of the heavily doped source and drain regions, and the dopant concentration of the heavily doped source and drain regions exceeds that of the lightly doped drain region. Preferably, the dopant concentration of the ultra-heavily doped source region is in the range of 1.5 to 10 times that of the heavily doped source and drain regions, and the dopant concentration of the heavily doped source and drain regions is in the range of 10 to 100 times that of the lightly doped drain region. Of course, the heavily doped source and drain regions need not have identical doping concentrations.

Further processing steps in the fabrication of IGFETs typically include forming a thick oxide layer over the active regions, forming contact windows (or vias) in the oxide layer to expose the silicide contacts, forming conductive plugs in the contact windows, and forming a metal-1 pattern on the thick oxide layer that selectively interconnects the plugs. Thereafter, more interlevel dielectrics with conductive plugs and additional metallization patterns (such as metal-2 through metal-5) can be formed. In addition, subsequent high-temperature process steps can be used to supplement or replace the anneal steps to provide the desired anneal, activation, and drive-in functions. These further processing steps are conventional and need not be repeated herein. Likewise the principal processing steps disclosed herein may be combined with other steps readily apparent to those skilled in the art.

The present invention includes numerous variations to the embodiments described above. For instance, in the first embodiment, the drain-protect dielectric can be used as a displacement layer (rather than an implant mask) by increasing the implant energy of the dopant that forms the heavily doped source region, or by decreasing the thickness of the dielectric layer that from which the drain-protect dielectric is formed. In the second embodiment, the dielectric layer from which the drain-protect dielectric is formed can consist of a single material (such as silicon dioxide) which is briefly etched to remove the upper portion without removing the lower portion before implanting the heavily doped source region and the lightly doped drain region. Also in the second embodiment, it is not critical that the photoresist layer that selectively exposes the polysilicon segment also cover the drain-protect dielectric, and in fact, if the photoresist layer exposes the entire drain-protect dielectric while covering the field dielectrics and the etch is highly selective with respect to polysilicon and silicon nitride then the subsequent photolithography and etch step that removes the upper portion of the drain-protect dielectric is no longer necessary.

The well, punchthrough and threshold adjust implants may not be essential, and various doping profiles for the source and drain can be used. The field dielectrics can be formed adjacent to the source, the drain, or both, or can be displaced from the IGFET manufactured with the drain-protect dielectric. If desired, additional dielectric isolation such as shallow-trench refill can be formed in the field regions, particularly in CMOS processes where the field regions separate N-channel and P-channel devices.

The gate can be various conductors, the gate insulator, spacers, field dielectrics and drain-protect dielectric can be various insulators including silicon dioxide, silicon nitride, silicon oxynitride and combinations or layers thereof, and the silicide contacts can be formed from various refractory metals such as titanium, tungsten, molybdenum, cobalt and tantalum. Other masking layers besides photoresist can be used, such as hard masks patterned using photolithography. The conductivity types can be reversed. Suitable N-type dopants include arsenic and phosphorus; suitable P-type dopants include boron $B_{10}$, boron $B_{11}$, and $BF_X$ species such as $BF_2$.

The invention is particularly well-suited for fabricating N-channel MOSFETs, P-channel MOSFETs and other types of IGFETs, particularly for high-performance microprocessors where high circuit density is essential. Although a single N-channel device has been shown for purposes of illustration, it is understood that in actual practice, many devices are fabricated on a single semiconductor wafer as is widely practiced in the art. Accordingly, the invention is well-suited for use in an integrated circuit chip, as well as an electronic system including a microprocessor, a memory and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention. Variations and modifications of the embodiments disclosed herein may be made based on the description set forth herein, without departing from the scope and spirit of the invention as set forth in the following claims.

What is claimed is:

1. A method of making an asymmetrical IGFET and providing a field dielectric between active regions of a semiconductor substrate, comprising the steps of:

providing a semiconductor substrate;

forming a dielectric layer over the substrate;

removing selected portions of the dielectric layer, wherein a first portion of the dielectric layer provides a field dielectric between active regions of the substrate, and a second portion of the dielectric layer provides a drain-protect dielectric over a drain region in an active region of the substrate;

forming a gate over the active region, wherein a sidewall of the gate is adjacent to a sidewall of the drain-protect dielectric;

implanting a dopant into the active region, wherein a greater concentration of the dopant is implanted in a source region in the active region than in the drain region due to the drain-protect dielectric; and forming a source in the source region and a drain in the drain region.

2. The method of claim 1, wherein forming the dielectric layer and removing the selected portions of the dielectric layer includes:

depositing the dielectric layer over the substrate;

forming a masking layer over the dielectric layer; and applying an etch to remove the selected portions of the dielectric layer.

3. The method of claim 1, wherein forming the gate includes:

depositing a layer of gate material over the substrate, wherein the gate material covers the drain-protect dielectric;

polishing the gate material to remove the gate material above the drain-protect dielectric;

forming a masking layer over the gate material; and applying an etch to remove the gate material over the source region.

4. The method of claim 1, including implanting the dopant to form a heavily doped source region in the source region using the drain-protect dielectric as an implant mask so that essentially none of the dopant is implanted into the drain region.

5. The method of claim 1, including implanting the dopant to form a heavily doped source region in the source region using the drain-protect dielectric as a displacement layer so that a lightly doped drain region is implanted into the drain region.

6. The method of claim 1, wherein the field dielectric is adjacent to the source region.

7. The method of claim 1, wherein the field dielectric is adjacent to the drain region.

8. The method of claim 1, wherein the gate is polysilicon, the dielectric layer is silicon dioxide, and the dopant is arsenic.

9. The method of claim 1, including providing an integrated circuit chip that contains the IGFET.

10. The method of claim 1, including providing an electronic system that includes a microprocessor, a memory, a system bus, and the IGFET.

11. A method of making an asymmetrical IGFET and providing a field dielectric between active regions of a semiconductor substrate, comprising the steps of:

providing a semiconductor substrate with an active region and a field region, wherein the active region includes a source region and a drain region, and the active region is adjacent to the field region;

forming a dielectric layer over the substrate;

forming a first etch mask over the dielectric layer;

etching a selected portion of the dielectric layer beneath an opening in the first etch mask, wherein a first unetched portion of the dielectric layer provides a field dielectric over the field region, a second unetched portion of the dielectric layer provides a drain-protect dielectric over the drain region, and the dielectric layer is removed above the source region;

forming a gate insulator on a portion of the active region outside the drain-protect dielectric;

depositing a gate material over the drain-protect dielectric and the gate insulator;

polishing the gate material so that a portion of the gate material over the drain-protect dielectric is removed;

forming a second etch mask over the gate material;

etching the gate material beneath an opening in the second etch mask to remove a portion of the gate material over the source region, wherein an unetched portion of the gate material forms a gate, and a sidewall of the gate is adjacent to a sidewall of the drain-protect dielectric;

implanting a dopant into the active region during a first implant step, wherein a greater concentration of the dopant is implanted in the source region than in the drain region due to the drain-protect dielectric; and forming a source in the source region and a drain in the drain region.

12. The method of claim 11, including:

implanting essentially none of the dopant into the drain region using the drain-protect dielectric as an implant mask during the first implant step; and implanting a lightly doped drain region into the drain region during a second implant step.

13. The method of claim 11, including implanting a lightly doped drain region into the drain region using the drain-protect dielectric as a displacement layer during the first implant step, wherein a peak concentration of the dopant is implanted into the source region and the drain-protect dielectric.

14. The method of claim 11, wherein the field dielectric is adjacent to the source region.

15. The method of claim 11, wherein the field dielectric is adjacent to the drain region.

16. The method of claim 11, including the following steps in the sequence set forth:

implanting a heavily doped source region into the source region without providing essentially any doping for the drain region using the drain-protect dielectric as an implant mask for the drain region during the first implant step;

removing the drain-protect dielectric;

implanting a lightly doped drain region into the drain region during a second implant step;

forming first and second spacers in close proximity to opposing sidewalls of the gate, wherein the first spacer is over the source region and the second spacer is over the drain region; and implanting a heavily doped drain region into the drain region outside the second spacer during a third implant step.

17. The method of claim 16, including implanting an ultra-heavily doped source region into the source region outside the first spacer during the third implant step.

18. The method of claim 17, wherein the heavily doped source region and the lightly doped drain region provide channel junctions, and the ultra-heavily doped source region and the heavily doped drain region are displaced from the channel junctions.

19. The method of claim 18, including forming silicide contacts on the ultra-heavily doped source region and the heavily doped drain region, wherein the field dielectric prevents forming a silicide contact on the field region.

20. The method of claim 16, wherein removing the drain-protect dielectric includes:

forming a third etch mask that covers the field dielectric and exposes the drain-protect dielectric; and etching the drain-protect dielectric through an opening in the third etch mask.

21. The method of claim 11, including the following steps in the sequence set forth:

removing an upper portion of the drain-protect dielectric without removing a lower portion of the drain-protect dielectric;

implanting a heavily doped source region into the source region and a lightly doped drain region into the drain region using the lower portion of the drain-protect dielectric as a displacement layer for the drain region during the first implant step;

forming first and second spacers in close proximity to opposing sidewalls of the gate, wherein the first spacer is over the source region and the second spacer is over the drain region; and implanting a heavily doped drain region into the drain region outside the second spacer during a third implant step.

22. The method of claim 21, including implanting an ultra-heavily doped source region into the source region outside the first spacer during the third implant step.

23. The method of claim 22, wherein the heavily doped source region and the lightly doped drain region provide channel junctions, and the ultra-heavily doped source region and the heavily doped drain region are displaced from the channel junctions.

24. The method of claim 23, including forming silicide contacts on the ultra-heavily doped source region and the heavily doped drain region, wherein the field dielectric prevents forming a silicide contact on the field region.

25. The method of claim 21, wherein removing the upper portion of the drain-protect dielectric includes:

forming a third etch mask that covers the field dielectric and exposes the drain-protect dielectric; and etching the drain-protect dielectric through an opening in the third etch mask.

26. The method of claim 25, wherein the upper and lower portions of the drain-protect dielectric are identical materials.

27. The method of claim 25, wherein the upper and lower portions of the drain-protect dielectric are different materials, and etching the drain-protect dielectric includes applying an etch that is highly selective of the upper portion of the drain-protect dielectric with respect to the lower portion of the drain-protect dielectric.

28. The method of claim 27, wherein the upper portion of the drain-protect dielectric is silicon nitride, and the lower portion of the drain-protect dielectric is silicon dioxide.

29. The method of claim 11, wherein the gate is polysilicon, the gate insulator and the dielectric layer are silicon dioxide, and the first and second etch masks are photoresist.

30. The method of claim 11, wherein the steps are performed in the sequence set forth.

31. A method of making an asymmetrical IGFET and providing a field dielectric between active regions of a semiconductor substrate, comprising the steps of:

providing a semiconductor substrate with an active region and a field region, wherein the active region includes a source region and a drain region, and the active region is adjacent to the field region;

forming a dielectric layer over the substrate;

forming a first photoresist layer over the dielectric layer;

etching a selected portion of the dielectric layer beneath an opening in the first photoresist layer, wherein a first unetched portion of the dielectric layer provides a field dielectric over the field region, a second unetched portion of the dielectric layer provides a drain-protect dielectric over the drain region, and the dielectric layer is removed above the source region;

removing the first photoresist layer;

growing a gate oxide on a portion of the active region outside the drain-protect dielectric;

depositing a polysilicon layer over the drain-protect dielectric and the gate oxide;

polishing the polysilicon layer so that the polysilicon layer over the drain-protect dielectric is removed;

forming a second photoresist layer over the polysilicon layer;

etching the polysilicon layer beneath an opening in the second photoresist layer to remove the polysilicon layer over the source region, wherein an unetched portion of the polysilicon layer forms a gate with first and second opposing sidewalls, and the second sidewall is adjacent to a sidewall of the drain-protect dielectric;

removing the second photoresist layer;

implanting a heavily doped source region into the source region and in substantial alignment with the first sidewall, wherein a greater concentration of a dopant is implanted in the source region than in the drain region due to the drain-protect dielectric;

implanting a lightly doped drain region into the drain region and in substantial alignment with the second sidewall;

depositing a conformal layer of spacer material over the substrate;

applying an anisotropic etch to form first and second spacers from unetched portions of the spacer material, wherein the first spacer is in close proximity to the first sidewall and is over the heavily doped source region, and the second spacer is in close proximity to the second sidewall and is over the lightly doped drain region;

implanting an ultra-heavily doped source region into the source region outside the first spacer and a heavily doped drain region into the drain region outside the second spacer during a third implant step;

applying a first thermal cycle to form a source in the source region and a drain in the drain region, wherein the source includes the heavily and ultra-heavily doped source regions, the drain includes the lightly and heavily doped drain regions, the heavily doped source region and the lightly doped drain region provide channel junctions, and the ultra-heavily doped source region and the heavily doped drain region are displaced from the channel junctions;

depositing a refractory metal over the substrate; and applying a second thermal cycle that reacts the refractory metal with the ultra-heavily doped source region and the heavily doped drain region and the gate without reacting the refractory metal with the field region due to the field dielectric, thereby forming silicide contacts on the ultra-heavily doped source region and the heavily doped drain region and the gate without forming silicide on the field region.

32. The method of claim 31, wherein the anisotropic etch forms a third spacer from an unetched portion of the spacer material over the active region and in close proximity to a sidewall of the field dielectric.

33. The method of claim 31, including removing all of the drain-protect dielectric after implanting the heavily doped source region.

34. The method of claim 31, including implanting the heavily doped source region and the lightly doped drain region simultaneously.

35. The method of claim 31, including implanting the heavily doped source region before implanting the lightly doped drain region.

36. The method of claim 31, wherein the field dielectric is adjacent to the source region.

37. The method of claim 31, wherein the field dielectric is adjacent to the drain region.

38. The method of claim 31, wherein the dielectric layer consists of silicon nitride on silicon dioxide.

39. The method of claim 31, wherein the dielectric layer consists of silicon dioxide.

40. The method of claim 31, wherein the steps are performed in the sequence set forth.

* * * * *